United States Patent [19]

Kinbara

[11] Patent Number: 4,840,924
[45] Date of Patent: Jun. 20, 1989

[54] METHOD OF FABRICATING A MULTICHIP PACKAGE

[75] Inventor: Kouji Kinbara, Tokyo, Japan
[73] Assignee: NEC Corporation, Tokyo, Japan
[21] Appl. No.: 115,565
[22] Filed: Oct. 29, 1987

Related U.S. Application Data

[62] Division of Ser. No. 753,231, Jul. 9, 1985, abandoned.

[30] Foreign Application Priority Data

Jul. 11, 1984 [JP] Japan .................. 59-143581
Jul. 16, 1984 [JP] Japan .................. 59-146035

[51] Int. Cl.$^4$ ............................................. H01L 21/23
[52] U.S. Cl. ..................... 437/189; 174/68.5; 29/847; 361/414; 437/180; 437/211
[58] Field of Search .............. 437/189, 209, 211; 357/67, 68, 71, 80; 174/68.5; 29/847; 361/414

[56] References Cited

U.S. PATENT DOCUMENTS

| | | | |
|---|---|---|---|
| 3,619,725 | 11/1971 | Soden et al. | 357/67 |
| 3,766,308 | 10/1973 | Loro | 357/67 |
| 3,849,757 | 11/1974 | Khammow et al. | 357/67 |
| 4,166,279 | 8/1979 | Gangulee et al. | 357/67 |
| 4,176,443 | 12/1979 | Iannuzzi et al. | 357/71 |
| 4,221,047 | 9/1980 | Narken et al. | 357/80 |
| 4,245,273 | 1/1981 | Feinberg et al. | |
| 4,407,007 | 9/1983 | Desai et al. | 357/80 |
| 4,549,200 | 10/1985 | Ecker et al. | 357/80 |

FOREIGN PATENT DOCUMENTS 55-43252 11/1980 Japan.

OTHER PUBLICATIONS

A. J. Blodgett, D. R. Barbour, Thermal Conduction Module: A High-Performance Multilayer Ceramic Package, IBM J. Develop. 26, pp. 30 to 36 (1982) Japanese Patent Publication No. Sho 55-4352.
North, James C. and Weick W. Walter, "Laser Coding of Bipolar Read-Only Memories", *IEEE Journal of Solid-State Circuits*, vol. SC-11, No. 4, Aug. 1976.
tent Publication No. Sho 55-43252.

*Primary Examiner*—Brian E. Hearn
*Assistant Examiner*—Beverly A. Pawlikowski
*Attorney, Agent, or Firm*—Burns, Doane, Swecker & Mathis

[57] ABSTRACT

A multichip package comprises a multilayer wiring substrate, and an array of contact pads having the ability to make wiring change formed on an uppermost layer of the substrate. The multichip package further comprises a plurality of IC chips mounted on the substrate. Each contact pad includes a connection conductor portion, and a separable conductive portion connecting a chip to an internal conductive layer provided in the substrate and integrally joined to the connection conductor portion. A connection is deleted by cutting the separable conductive portion thereafter to connect a wire to the connection conductor for making a wiring change, thus realizing the multichip package provided with an engineering change contact pad having excellent connecting and cutting functions. Further, IC chips are mounted on the substrate by making use of a solder dam of polyimide resin formed by applying a photosensitive polyimide precursor solution to the substrate, thus providing good contact between the chips and the substrate.

2 Claims, 3 Drawing Sheets

METHOD OF FABRICATING A MULTICHIP PACKAGE

This application is a divisional of application Ser. No. 753,231, filed July 9, 1985 now abandoned.

BACKGROUND OF THE INVENTION

The present invention relates to a multichip package, and more particularly to a multilayer multichip module provided with an array of contact pads having the ability to make a wiring change. Further, the present invention is also concerned with a multichip package wherein IC chips are mounted on a multilayer wiring substrate by making use of an improved solder dam structure formed thereon.

PRIOR ART

In the prior art, when engineering change is needed in a multilayer wiring substrate, there is employed a method of effecting wiring changes as described in A. J. Blodgett, D. R. Barbour, Thermal Conduction Module: A High-Performance Multilayer Ceramic Package, IBM J. DEVELOP. 26, PP. 30 to 36 (1982) or in U.S. Pat. No. 4,245,273. In accordance with this method, in a multilayer multichip module as shown in FIG. 1, a multilayer wiring substrate includes redistribution layers, signal distribution layers, and power distribution layers and an array of contract pads having the ability to make wiring change is formed on an uppermost layer of the multilayer wiring substrate wherein each contact pad includes a conductive wiring connected from an internal conductive layer to a chip, and a connection conductor portion joined to the conductive wiring and used when an engineering change is needed. When a wiring change is needed, a conductive wiring on the surface of the substrate is cut off to electrically separate the internal conductive layer from the chip, thereafter connecting a wire to the connection conductor portion e.g. using ultrasonic bonding. Thus, this method can provide the ability to make engineering changes, which is essential during the design and debug phase of the system development, but has the following drawback resulting from lack of consideration with regard to the fact that the conductive wiring and connection conductor portion have functions different from each other. Namely, in accordance with this method, both the conductive wiring to be cut off and the connection conductor portion to which a wire is connected are formed in the same process, with the result that the conductive wiring to be cut off is formed with it having the same structure as the connection conductor portion. Such an engineering change contact pad in the multilayer wiring substrate described in the above-mentioned references will be referred to with reference to FIG. 2. The contact pad comprises two connection conductor portions 11 and one conductive wiring portion to be cut or separated (which will be called a "separable conductive portion" hereinafter) 12 wherein there is no difference in structure between both portions 11 and 12, i.e., they employ the same conductive material and have the same thickness of conductive portions. However, the objects and the functions of the connection conductor portion and the separable conductive portion are different from each other. That is, the connection conductor portions are portions to which wirings for engineering changes and IC leads are connected, requiring excellent characteristics for soldering, thermocompressive bonding or ultrasonic bonding etc. On the other hand, the separable conductive portion requires that it serves as a conductor having high reliability in ordinary conditions and has the ability to be easily cut off when needed. In accordance with the above-mentioned conventional method, the connection conductor portion and the separable conductive portion which have different functions have been formed in such a manner that they are of the same structure. Accordingly, this makes it unable to sufficiently exhibit individual characteristics.

Meanwhile, when packaging of a semiconductor is implemented, in particular when IC chips e.g. flip chips are bonded on a multilayer wiring substrate, a solder-retaining portion called a "solder dam" is provided on the substrate to retain the melted solder within a predetermined area so that it does not flow towards undesired portions. Thus, each chip is face-bonded to the substrate by means of a solder retained by the solder dam.

A method of forming such a solder dam in soldering portions on a substrate using a polyimide resin is described in e.g. Japanese Patent Application Laid-open No. 55-43252. This method comprises the steps of applying a non-photosensitive polyimide prepolymer solution on a metallic pattern, implementing heat treatment thereto to produce a polyimide resin layer, thereafter etching the polyimide resin layer using a photoresist etc. to form a pattern of solder dam required. However, with this method, since the polyimide resin layer is first formed and thereafter is etched, the number of necessary processes is increased, with the result that it takes a long time to complete the solder dam.

In addition, the drawback with this method is that since there are few resists which can tolerate an etching agent or etchant of the polyimide resin, it is difficult to form a pattern having high precision and high density.

SUMMARY OF THE INVENTION

With the above in mind, an object of the present invention is to provide a multichip package having, on a multilayer wiring substrate, an engineering change contact pad which sufficiently exhibits individual functions of a separable conductive portion and a connection conductor portion.

Another object of the present invention is to provide a multichip package wherein IC chips are mounted on a multilayer wiring substrate by making use of a novel solder dam of polyimide resin which has eliminated the drawbacks encountered in the prior art.

According to the present invention, there is provided a multichip package comprising: a multilayer wiring substrate; a plurality of integrated circuit chips mounted on the multilayer wiring substrate; and an array of contact pads having the ability to make wiring change formed on an uppermost layer of the multilayer wiring substrate, each pad comprising a connection conductor portion and a separable conductive portion joined to the connection conductor portion, the separable conductive portion connecting at least one of the chips to a corresponding internal conductive layer, the connection conductor portion having a conductive layer configuration different from the connection conductor portion.

The separable conductive portion is formed of a conductive material different from that of the connector conductor portion. Further, a conductive layer formed in the separable conductive portion has a thickness different from that of the connection conductor portion.

The integrated circuit chips may be mounted on the multilayer wiring substrate by means of a solder dam of polyimide resin. The polyimide resin may be applied to the substrate in the form of a photosensitive polyimide precursor solution.

The connection conductor portion may be provided with a copper plating layer on a double thin film layer comprising a first layer of chromium and a second layer of palladium. The chromium thin film layer has a thickness ranging from 500 to 1000 angstroms, and the palladium thin film layer has a thickness ranging from 300 to 3000 angstroms. Alternatively, a nickel plating layer which is 1 to 5 micron thick and a gold plating layer which is 0.5 to 2 microns thick may be formed on the copper plating layer. In a further alternative form, a palladium plating layer which is 0.5 to 4 micron thick may be formed on the copper plating layer. The first layer may be formed of metal e.g. titanium, tungsten, nichrome, aluminum, or tantalum etc. The second layer may be formed of metal e.g. platinum, nickel, or copper etc.

The separable conductive portion may comprise a triple layer comprising chromium, palladium and copper thin film layers formed on a substrate, and nickel plating and gold plating which are implemented on the triple layer.

The chromium thin film layer has a thickness ranging from 50 to 1000 angstrom, the palladium thin film layer has a thickness ranging from 300 to 3000 angstoms, and the copper thin film has a thickness ranging from 1000 to 5000 angstroms. The total thickness of the nickel plating layer and the gold plating layer is less than 4 microns.

A method of fabricating the contact pad having the ability to make wiring change may include the steps of forming a multilayer thin film conductive layer comprising chromium, palladium and copper layers on an insulating layer by sputtering or vacuum deposition, coating a photoresist on the multilayer thin film conductive layer, implementing exposure and development processes to the photoresist, thus forming a pattern including the separable conductive portion, thereafter forming a wiring layer including the separable conductive portion by implementing a multilayer plating process to form nickel and gold plating layers, stripping off the photoresist, coating a photoresist for a second time, implementing exposure and development process to form a pattern including the connection conductor portion, implementing a plating process to form a wiring layer, thereafter stripping off the photoresist, and implementing an etching process to remove the thin film conductive layer except for the wiring layer.

The connection conductor portion may mainly comprise a copper plating layer having a thickness of about 10 microns and the separable conductive portion configured as a double plating layer comprising a nickel plating layer having a thickness of 1 micron and a gold plating layer having a thickness of 2 microns. The connection conductor portion may comprises a gold plating layer having a thickness of 5 to 10 microns and the separable conductive portion may comprise a gold plating layer having a thickness of 1.5 to 3 microns.

The multilayer wiring substrate is resistant to temperature more than 300° C. The multilayer wiring substrate may be comprised of a ceramic substrate. A method of forming the solder dam may comprise the steps of spincoating a photosensitive polyimide varnish on the multilayer wiring substrate, drying it in an oven, implementing exposure and development processes, and implementing thermal treatment.

BRIEF DESCRIPTION OF THE DRAWINGS

The features and advantages of a multichip package according to the present invention will become more apparent from the following description taken in conjunction with the accompanying drawings in which.

DETAILED DESCRIPTION OF THE PREFERRED EMBODIMENTS

Figure 4:
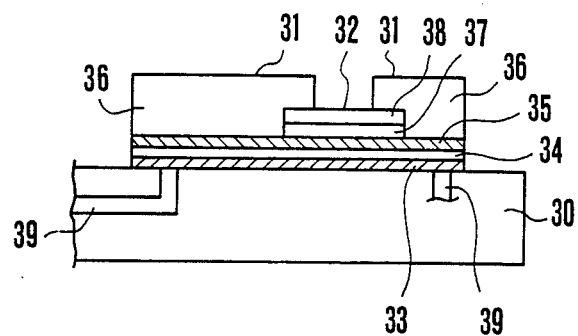
FIG. 4 is a longitudinal cross section illustrating a second embodiment of an engineering change contact pad provided on a multilayer wiring substrate in the present invention.
Figure 5:
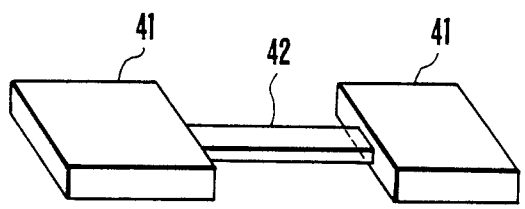

First, various embodiments of an engineering change contact pad employed in a multichip package according to the present invention will be described with reference to FIGS. 3 to 5.

Figure 1:
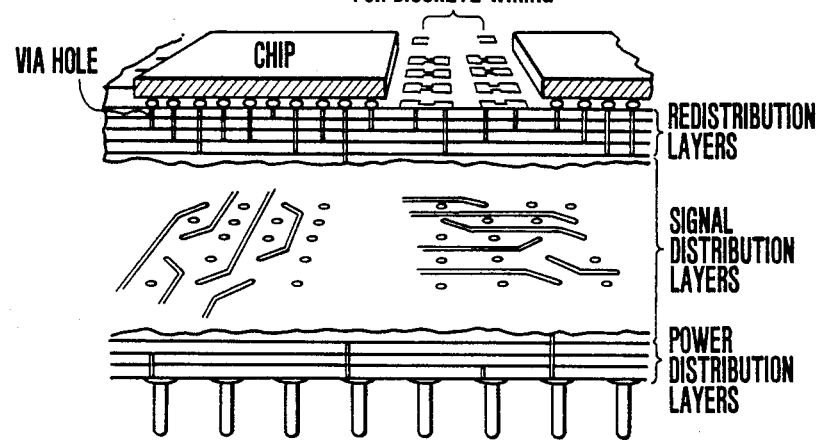
FIG. 1 is a fragmentary sectional view showing the construction of a multilayer multichip module.
Figure 2:
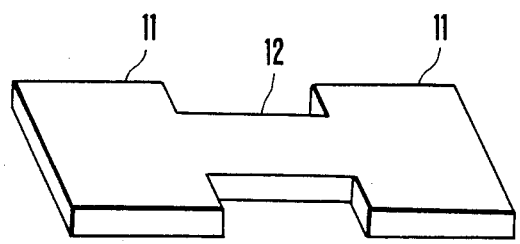
FIG. 2 is a perspective view schematically illustrating an example of an engineering change contact pad employed in the prior art.
Figure 3:
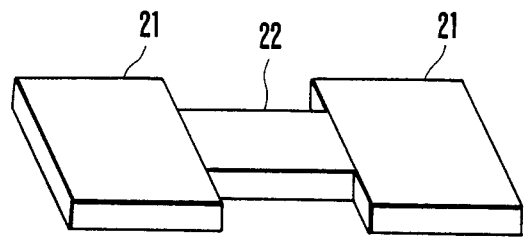
FIGS. 3 and 3a illustrate a first embodiment of an engineering change contact pad employed in the present invention.
Figure 3A:
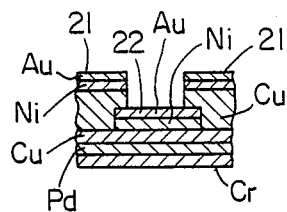
Figure 5A:
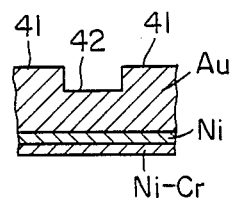
FIGS. 5 and 5a illustrate a third embodiment of an engineering change contact pad employed in the present invention.

FIG. 3 is a perspective view illustrating a first embodiment of the engineering change contact pad in the present invention.

The engineering change contact pad comprises two connection conductor portions 21 and a separable conductive portion 22 provided therebetween. Each connection conductor portion 21 includes a double layer comprising a first thin film layer of chromium (Cr) and second thin film layer of palladium (Pd) which are formed on a substrate (not shown) and a layer formed on the double layer by implementing copper (Cu) plating thereon. The chromium layer has a thickness ranging from 500 to 1000 angstroms. The palladium layer has a thickness ranging from 300 to 3000 angstroms. The copper plating layer has a thickness ranging from 3 to 20 microns. According to need, a nickel (Ni) plating layer which is 1 to 5 microns thick and a gold (Au) plating layer which is 0.5 to 2 microns thick may be formed on the copper plating layer, or a palladium plating layer which is 0.5 to 4 microns thick may be formed thereon. These metal materials are selected in dependence upon a wire connecting method, i.e., soldering, thermocompressive bonding or ultrasonic bonding etc. Instead of chromium, the first thin film layer may employ metal, such as, for example, titanium (Ti), tungsten (W), nichrome (nickel alloy), aluminum (Al), tantalum (Ta) etc. Further, instead of palladium, the second thin film layer may employ metal, such as, for example, platinum (Pt), nickel (Ni), copper (Cu) etc. On the other hand, the separable conductive portion 22 comprises a triple layer comprising chromium, palladium and copper thin film layers which are formed on a substrate (not shown), and two layers formed on the triple layer by implementing nickel plating and gold plating thereon. The chromium thin film layer has a thickness ranging from 50 to 1000 angstroms. The palladium thin film layer has a thickness ranging from 300 to 3000 angstroms. The copper thin film layer has a thickness ranging from 1000 to 5000 angstroms. It is preferable that the total thickness of the nickel plating layer and the gold plating layer is less than 4 microns in order to easily cut or separate the separable conductive portion. Such a cutting or separation may employ a laser or ultrasonic cutter, a diamond cutter, or a carbide cemented knife etc.

An example of a fabricating method for the engineering change contact pad will be described.

First, a multilayer thin film conductive layer comprising chromium, palladium and copper layers is formed by using sputtering or vacuum deposition etc. The multilayer configuration is desirably determined by taking into account contact between an insulating layer and each wiring layer formed in the subsequent process and the other condition etc. Then, a photoresist is coated on the multilayer thin film conductor layer to implement exposure and development processes, thus forming a pattern including the separable conductive portion. Then, a multilayer plating process comprising a nickel plating process and a gold plating process is implemented to form a wiring layer including the separable contact portion. The reason why the stacked nickel and gold layers are employed is that gold plating layer can be easily cut by infrared laser beam. The underlying nickel plating layer is needed for establishing good contact between the ground thin film layer of copper and the gold plating layer, and for preventing the conductivity of the gold in the wiring layer from being seriously lowered due to the fact that the gold is alloyed by a gold-tin (Au-Sn) solder when the gold-tin solder flows from the soldering portion into the pattern defining the separable portion. The wiring layer configuration is desirably determined by taking into account the nature of a high energy radiation beam and a cutting method etc.

Next, a process is used to strip off the photoresist to coat a photoresist for a second time. Then, exposure and development processes are conducted to form a pattern having connection conductor portions, thereafter implementing a plating process to form a wiring layer having the connection portion. The metal employed as the wiring layer is determined by the connecting method. For instance, when connection is established by means of gold-tin solder, copper or palladium may be preferably used. Finally, a process is implemented to strip off a photoresist, thereafter carrying out an etching process to remove a thin film conductor layer except for the wiring layer.

Thus, there is formed the contact pad having the ability to make a wiring change configured so that the separable conductive portion has a conductive layer configuration different from the connection conductor portion, thereby allowing the separable conductive portion to be easily separated or cut.

A second embodiment of the engineering change contact pad will be described with reference to FIG. 4 wherein a separable conductive portion is formed by implementing nickel and gold platings thereto and a connection conductor portion is formed by implementing thereto a copper plating. More particularly, the multichip package shown in FIG. 4 comprises a ceramic multilayer substrate 30 in which conductor circuits are formed in internal layers and a surface layer, a triple layer comprising a titanium thin film layer 33, a palladium thin film layer 34, and a copper thin film layer 35 which are stacked on the surface of the substrate 30, two connection conductor portions 31 to which copper plating is implemented, and a separable conductive portion 32 comprising a nickel plating layer 37 and a gold plating layer 38. The multichip package further comprises a via hole and wiring connecting the engineering change control pad with internal layer signal wiring portions or portions for connecting lead terminals of IC chips. The titanium thin film layer 33, the palladium thin film layer 34 and the copper thin film layer 35 have thicknesses ranging from 500 to 3000 angstrom, respectively. The connection conductor portion 31 is mainly formed of the copper plating layer 36 which is approximately 10 microns thick. The double layer constituting the separable conductive portion 32 comprises the nickel plating layer 37 which is 1 micron thick and the gold plating layer 38 which is 2 microns thick.

Then, a third embodiment of the engineering change contact pad will be described with reference to FIG. 5. Each of two connection conductor portions 41 and separable conductive portion 42 comprises a nickel thin film layer formed on a nichrome thin film layer on a substrate (not shown), and a layer formed by implementing gold plating thereon. The nichrome thin film layer is 500 to 2000 angstroms thick and the nickel thin film layer is 1000 to 3000 angstroms. The gold plating layer in the connection conductor portion 41 is 5 to 10 microns thick and the gold plating layer in the separable conductive portion 42 is 1.5 to 3 microns thick. The reason why the thicknesses of both the plating layers are different from each other is that the gold plating layer of the connection conductor portion 41 is preferably more than 5 microns in order to obtain connection having high reliability, whereas the gold plating layer of the separable contact portion 42 is preferably less than 3 microns in view of easiness of cutting.

As stated above, the engineering change contact pad described in the above-mentioned ebodiments of the invention is configured so that the separable conductive portion has a conductive layer configuration different from the connection conductor portion, i.e., both portions are formed by using different conductive materials or have different thicknesses of respective conductive layers. Thus, this makes it possible to provide an engineering change contact pad having excellent connecting and cutting functions. Such engineering change contact pads are particularly advantageous when applied to multichip packages.

Figure 6:
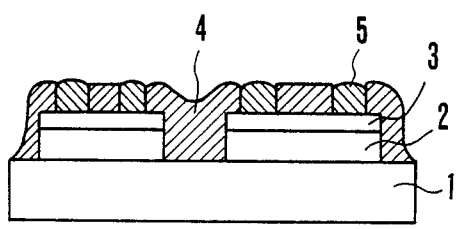
FIG. 6 is a cross sectional view illustrating a solder dam formed on a multilayer wiring substrate in the present invention.

Then, a preferred embodiment of a solder dam utilized for mounting IC chips on a multilayer wiring substrate will be described with reference to FIG. 6.

In this embodiment, there is employed a ceramic multilayer substrate for providing a solder dam thereon. For the purpose of using polyimide as material for a solder dam, a substrate material which can tolerate temperatures more than 300° C. is required. The ceramic substrate can satisfy this condition. It is needless to say that conductor circuits are formed in internal layers and a surface layer of the ceramic multilayer substrate 1, although their illustration is omitted. The substrate is provided on the upper surface thereof with copper plating layers 2, and palladium plating layers 3 formed on the copper plating layers 2 respectively. Thus, conductive portions for soldering are formed by these layers 2 and 3. Each copper plating layer 2 forms, on an insulating layer, a conductive pattern of other required wiring in conjunction with the conductive portion for soldering. It is well known that copper has excellent characteristics with respect to the soldering using tin-lead (Sn-Pb) solder. On the copper plating layer 2, palladium plating is implemented to form the palladium plating layer 3.

On the substrate on which the copper plating layer 2 and the palladium plating layer 3 are formed, there is formed a solder dam 4 of polyimide resin applied to the substrate 1 in the form of a photosensitive polyimide precursor. When forming the solder dam 4, a photosensitive polyimide varnish is coated on the substrate 1 with a spinner etc. to effect drying in an oven. Then, an exposure process is implemented and thereafter, a development process is implemented using a specific developer. In this instance, because the surface of the conductive portion is formed with the palladium layer, the remains of development do not occur. Then, heat treatment is conducted to form the solder dam 4 of polyimide. The photosensitive polyimide varnish may employ a photo varnish named UR-3100 manufactured by TORAY INDUSTRIES, INC.

Thus, after the solder dam 4 is formed, a soldering is carried out to form solder layers 5. In this instance, because the surface of the conductive portion is formed with the palladium layer, there is not possibility that the solder dam 4 strips off. Thus, an excellent soldering work has been carried out. For this reason, the palladium is quitely effective in view of elimination of the remains of development of polyimide varnish, soldering fittness and good contact with polyimide.

For experimentarily confirming this effect, two kinds of wiring substrates are prepared. In a first substrate, there are formed a conductive portion for soldering and other required wiring portions are formed by copper plating. On the other hand, a second substrate is configured so that gold plating is further implemented on the copper plating of the first substrate. The above-mentioned solder dam 4 of polyimide is then formed on both the substrates. As a result, when the first substrate is used, the remains of development occur, failing to form an excellent conductive portion for soldering. In contract, when the second substrate is used, the reamins of the development do not occur. However, the drawback with the second substrate is that the solder dam 4 slips off the surface of the conductive surface during the soldering work, resulting in occurrence of fault portions.

As stated above, in accordance with the fabricating method for the solder dam, first the palladium plating layer is formed on the copper plating layer to form the conductive portion for soldering. Then, a solder dam of polyimide resin is formed by applying a photosensitive polyimide precursor solution to the substrate. Accordingly, this provides a good contact between palladium and polyimide. Thus, a solder dam of polyimide resin can be formed with high precision and high density. In additon, such a solder dam can be easily formed by a series of processes comprising a coating of the photosensitive polyimide precursor solution, drying, exposure, development and thermosetting. In particular, the development of a coating film of a photosensitive polyimide precursor is facilitated.

What is claimed is:

1. A method of fabricating a multichip package having an array of contact pads, each pad including a connection conductor portion and a separable conductive portion, particularly for fabricating said contact pad having the ability to make wiring changes, comprising the steps of: forming a multilayer thin film conductive layer comprising chromium, palladium and copper layers on an insulating layer; coating a photoresist on said multilayer thin film conductive layer; implementing exposure and development processes to said photoresist to form a first pattern including said separable conductive portion; implementing a multilayer plating process to form a first wiring layer constituted by nickel and gold plating layers and including said separable conductive portion, thereafter stripping off said photoresist; coating a photoresist on said multilayer thin film conductive layer and said first wiring layer for a second time; implementing exposure and development processes to said photoresist to form a second pattern including said connection conductor portion; implementing a plating process to form a second wiring layer including said connection conductor portion, thereafter stripping off said photoresist; removing the thin film conductive layer except for said first and second wiring layers, thereby completing a conductive portion for soldering; and thereafter forming a solder dam made of a photosensitive polyimide varnish on said insulating layer on which said conductive portion for soldering is formed.

2. A method of fabricating a multichip package as set forth in claim 1, wherein said step for forming said solder dam comprises the steps of spin-coating the photosensitive polyimide varnish on said insulating layer on which said conductive portion for soldering is formed, drying it in an oven, implementing an exposure and development process, and implementing thermal treatment.

* * * * *